(12) United States Patent
Trefzer et al.

(10) Patent No.: US 9,143,131 B2
(45) Date of Patent: Sep. 22, 2015

(54) FIELD-PROGRAMMABLE GATE ARRAY

(71) Applicants: Martin Trefzer, Yorkshire (GB); Andrew Tyrrell, York (GB); James Walker, York (GB)

(72) Inventors: Martin Trefzer, Yorkshire (GB); Andrew Tyrrell, York (GB); James Walker, York (GB)

(73) Assignee: The University of York (GB)

( * ) Notice: Subject to any disclaimer, the term of this patent is extended or adjusted under 35 U.S.C. 154(b) by 0 days.

(21) Appl. No.: 14/355,859

(22) PCT Filed: Nov. 2, 2012

(86) PCT No.: PCT/GB2012/052738
§ 371 (c)(1),
(2) Date: May 2, 2014

(87) PCT Pub. No.: WO2013/064839
PCT Pub. Date: May 10, 2013

(65) Prior Publication Data
US 2014/0292369 A1  Oct. 2, 2014

(30) Foreign Application Priority Data
Nov. 4, 2011  (GB) .................................. 1119099.8

(51) Int. Cl.
*H03K 19/177* (2006.01)
*H03K 19/0175* (2006.01)
*G06F 17/50* (2006.01)

(52) U.S. Cl.
CPC .... *H03K 19/017581* (2013.01); *G06F 17/5027* (2013.01); *H03K 19/17748* (2013.01)

(58) Field of Classification Search
CPC .......... H03K 19/177; H03K 19/17748; H03K 19/17736

USPC ...................................................... 326/37–41
See application file for complete search history.

(56) References Cited

U.S. PATENT DOCUMENTS

| 5,289,021 A | 2/1994 | El Gamal |
| 6,278,290 B1 | 8/2001 | Young |
| 6,724,220 B1 * | 4/2004 | Snyder et al. .................... 326/39 |
| 8,117,247 B1 * | 2/2012 | Taylor ........................... 708/235 |
| 8,487,653 B2 * | 7/2013 | Tarng et al. ..................... 326/41 |
| 2007/0007999 A1 * | 1/2007 | Graham et al. .................. 326/38 |

(Continued)

FOREIGN PATENT DOCUMENTS

| WO | WO-2009060190 A2 | 5/2009 |
| WO | WO-2013064839 A3 | 5/2013 |

OTHER PUBLICATIONS

"International Application Serial No. PCT/GB2012/052738, International Search Report mailed Dec. 7, 2013", 3 pgs.

(Continued)

*Primary Examiner* — Don Le
(74) *Attorney, Agent, or Firm* — Schwegman Lundberg & Woessner, P.A.

(57) ABSTRACT

An FPGA has a number of CLBs, each CLB having a number of CABs (10, 110, 210, 310, 410). Each CAB (10, 110, 210, 310, 410) comprises: a number of configurable transistors (20, 120, 220, 320, 420) each comprising one or more useable transistors M and a number of switching transistors; and, configuration circuitry comprising a number of switching transistors. The ratio of switching transistors to useable transistors for each CAB is less than 26:1. A method of configuring such an FPGA comprises optimizing each configurable transistor.

19 Claims, 10 Drawing Sheets

(56) References Cited

U.S. PATENT DOCUMENTS

| | | | |
|---|---|---|---|
| 2009/0243742 A1 | 10/2009 | Rofougaran | |
| 2010/0182042 A1 | 7/2010 | Law et al. | |
| 2013/0229882 A1* | 9/2013 | Hafez et al. | 365/189.16 |
| 2013/0293264 A1* | 11/2013 | Gupta | 326/45 |

OTHER PUBLICATIONS

"United Kingdom Application Serial No. 1119099.8, Search Report mailed Feb. 28, 2012", 1 pg.

Langeheine, Jorg, et al., "On the Evolution of Analog Electronic Circuits Using Building Blocks on a CMOS FPTA", Lecture Notes in Computer Science, vol. 3102, (2004), 1316-1327.

Stoica, A., et al., "Evolution of analog circuits on field programmable transistor arrays", The Second NASA/DoD Workshop on Evolvable Hardware, 2000. Proceedings., [online]. Retrieved from the Internet: <URL: www.cs.york.ac.uk/rts/docs/GECCO_2004/Conference%20proceedings/papers/3102/31021316.pdf>, (Jul. 13, 2000), 99-108.

* cited by examiner

| Configuration | Function (Standard Output) | Function (Inverted Output) |
|---|---|---|
| 0 | Inverter | Buffer |
| 1 | NAND-2 | AND-2 |
| 2 | NOR-2 | OR-2 |
| 3 | NAND-3 | AND-3 |
| 4 | NOR-3 | OR-3 |
| 5 | AND-OR-INV-21 | AND-OR-21 |
| 6 | OR-AND-INV-21 | OR-AND-21 |
| 7 | PROG-AND-OR-INV-2 | PROG-AND-OR-2 |

FIG. 7

| Configuration | Function (Standard Output) | Function (Inverted Output) |
|---|---|---|
| 0 | Inverter | Buffer |
| 1 | 2-input XOR | 2-input XNOR |
| 2 | 2-input XNOR | 2-input XOR |
| 3 | 2-input multiplexor | 2-input multiplexor with inverted output |
| 4 | Tri-state inverter | Tri-state inverter with inverted output |
| 5 | Tri-state inverter with enable | Tri-state inverter with enable and inverted output |
| 6 | Clocked multiplexor | Clocked multiplexor with inverted output |
| 7 | Two inverters with common output | Two inverters with common inverted output |

FIG. 10

FIELD-PROGRAMMABLE GATE ARRAY

PRIORITY APPLICATIONS

This application is a U.S. National Stage Filing under 35 U.S.C. 371 from International Application No. PCT/GB/2012/052738, filed on 2 Nov. 2012, and published as WO 2013/064839 on 10 May 2013, which claims the benefit of priority under 35 U.S.C. 119 to Great Britain Application No. GB1119099.8, filed on 4 Nov. 2011; which applications and publication are incorporated herein by reference in their entirety.

The invention relates to improvements in or relating to reconfigurable semiconductor devices, particularly field-programmable gate arrays (FPGAs).

An FPGA is an example of a reconfigurable semiconductor device for digital signal processing. It can be configured after manufacturing to a system/application designer's specific requirements, which is particularly advantageous when it comes to prototyping new devices. FPGAs have been around for about twenty-five years.

A typical FPGA consists essentially of a matrix of cells each containing a number of logic blocks that are configurable into functional units. Each of the logic blocks is made up of transistors. A number of functional units may be combined to form a digital circuit. Look up tables and flip flops are used to implement the logic functionality. The configuration and arrangement of transistors cannot be changed.

In the continued drive for device improvement and with advances in semiconductor fabrication technology, transistors within devices are being made ever smaller. The size of a transistor is typically quoted in terms of its length and devices are now being produced where the transistors are around 22 nm long. However, a problem that device manufacturers face in operating at these dimensions, approaching atomistic levels, is increasing intrinsic variability. In particular, the stochastic component of intrinsic variability causes transistor behaviour to become unpredictable and often outside acceptable tolerance limits. For device manufacturers, this means increased design and production time and cost, and decreased reliability and yield.

Static random access memories (SRAMs) and latches have been identified as elements for which the effects of stochastic variability will be clearly evident as transistor sizes reduce. This will have an effect on FPGAs which have SRAMs and latches in their look-up tables and flip flops.

Work has been done using bio-inspired algorithms in conjunction with statistical Spice simulations on high-performance computing resources to optimise transistor sizes in logic standard cells, such as flip-flops, for performance and stochastic variability tolerance. This work could be applied to devices such as FPGAs to alleviate the effects of stochastic variability, but the simulations involved would be too time intensive to provide a practical solution. It would be preferable to perform an optimisation of transistor size directly in hardware so as to accelerate the optimisation process. In the case of an FPGA, functional programmability is limited to the logic level and access is not available directly to the transistors that make up the logic blocks.

A field programmable transistor array (FPTA) is another example of a reconfigurable semiconductor device. It consists of an array of transistors that are configurable as a number of different analogue signal processing components. Configuration is at the transistor level and includes the option of varying transistor lengths and widths. FPTAs have been around for about ten years.

FPTAs have never been realised in anything other than what may be termed "old semiconductor technology" in the sense that their transistor sizes have not developed significantly since their conception. Transistor sizes in FPTAs are typically of the order of 0.6 µm, much bigger than the sizes now being achieved in other devices. In addition, each configurable transistor of an FPTA comprises a number of useable transistors, that is to say, transistors that process a digital signal. Each useable transistor requires extensive configuration circuitry, which consists of a number of clusters of transistors performing switching functions, otherwise known as switching transistors. The ratio of switching transistors to useable transistors in an FPTA is typically of the order of around 30:1, 26:1 being the best achievable that is known, which means that a large amount of device area is consumed per configurable transistor and that parasitic effects are prevalent and predominant.

One way of providing transistor size optimisation in an FPGA would be to incorporate FPTA configurability at the configurable transistor level of the FPGA. However, notwithstanding the incompatible transistors sizes, so many of the transistors of the FPGA would be utilised in configuration circuitry that any reasonable sized device would be impractical, particularly in terms of speed and power consumption and the area of substrate required. What is more, parasitic effects would significantly degrade performance.

The invention provides an FPGA having a number of configurable logic blocks (CLBs), each CLB having a number of configurable analogue blocks (CABs), each CAB comprising:

a number of configurable transistors each comprising one or more useable transistors and a number of switching transistors;

configuration circuitry comprising a number of switching transistors; wherein the ratio of switching transistors to useable transistors in the CAB is less than 26:1.

In essence, the invention combines FPGA technology with modified FPTA technology. The modification consists of providing an FPTA-type architecture which is limited in its capabilities in the sense that, in comparison to conventional FPTA architecture, it is only capable of realising a limited number of logic building blocks which are necessary to implement the functions required at the logic level. As a consequence, the number of switching transistors is substantially reduced so that device area consumption and parasitic effects are no longer such significant issues. In other words, the ratio of switching transistors to useable transistors is to a large extent indicative of the limited functionality of the architecture. It is possible to vary the ratio whilst still maintaining the same functionality, albeit variable performance architecture, by varying the way in which the architecture is implemented at the transistor level, but the limited functionality is the predominant factor in determining the ratio. At the same time, the invention maintains the transistor configurability capability of conventional FPTA technology. The result is a device which is both practical as well as offering optimisation of transistor size at the hardware level.

In one embodiment, the configuration circuitry comprises a number of configurable routing blocks each used to connect two or more configurable transistors together to form into logic building blocks. One example of a configurable routing block comprises a number of switches and each switch has an associated configuration memory, wherein each switch comprises a number of the switching transistors from the configuration circuitry and each configuration memory comprises an SRAM comprising one or more switching transistors from the configuration circuitry.

In an alternative embodiment, the configuration circuitry comprises a configurable interconnect block adapted to configure the configurable transistors into logic building blocks. With the configurable interconnect block, switches are not needed between the configurable transistors, which is beneficial in terms of reducing parasitic effects. The configurable interconnect block may have an output for each configurable transistor and each output may serve to involve the corresponding configurable transistor in a logic building block, to render the corresponding configurable transistor effectively "transparent" in terms of the role it plays in the logic building block or to shut the corresponding configurable transistor down. In one example, the configurable interconnect block comprises: a number of switches, each comprising a number of switching transistors from the configuration circuitry; a decoder comprising a number of switching transistors from the configuration circuitry; and, a number of SRAM BITS, each comprising one or more switching transistors from the configuration circuitry. Another embodiment further comprises configurable inverters which comprise configurable transistors.

In yet another embodiment, the configurable transistors are arranged into configurable transistor branches and each branch represents at least one logic motifs/structures. The logic motifs/structures are combined to form logic building blocks. A further embodiment further comprises configurable inverters which comprise configurable transistors.

Preferably, each configurable transistor comprises a number of useable transistors, wherein each useable transistor is a different length and/or width and various different lengths and widths of useable transistor are combined to form various different lengths and widths of configurable transistor. The widths of the various different useable transistors may be selected so that the useable transistors can be combined into a range of configurable transistor width values, and wherein the increment between each successive value in the range is the same. For example, each configurable transistor may comprise seven useable transistors, each 40 nm long and ranging in width from 120 nm to 220 nm in increments of 20 nm. Additionally or alternatively preferably, each useable transistor may be one of a number of different layouts. Each useable transistor may have an associated programmable switch comprising a switch and a configuration memory, and the switch may comprise a number of the switching transistors from the configurable transistor and the configuration memory may comprise one or more switching transistors from the configurable transistor.

The invention further provides a method of configuring an FPGA according to any preceding claim comprising optimising each configurable transistor. Optimisation may be for industry standard performance metrics such as speed and power consumption. The industry standard performance metrics may take into account the effects of stochastic variability to ensure reliability.

The invention also provides a method of scaling the logic functionality of a CAB whilst maintaining a constant ratio of switching transistors to useable transistors.

The invention will now be described, by way of example, with reference to the drawings, in which:

FIG. 7 is a table showing the realisable logic building blocks of the CABs shown in FIGS. 5 and 8;

FIG. 10 is a table showing the realisable logic functions of the CABs shown in FIGS. 6 and 9.

In each figure there are a number of items that are identical, but, for the sake of clarity, not all of the identical items (identifiable by their common symbols) have been identified with a reference number; only a selection of each of the identical items are generally identified.

Figure 1:
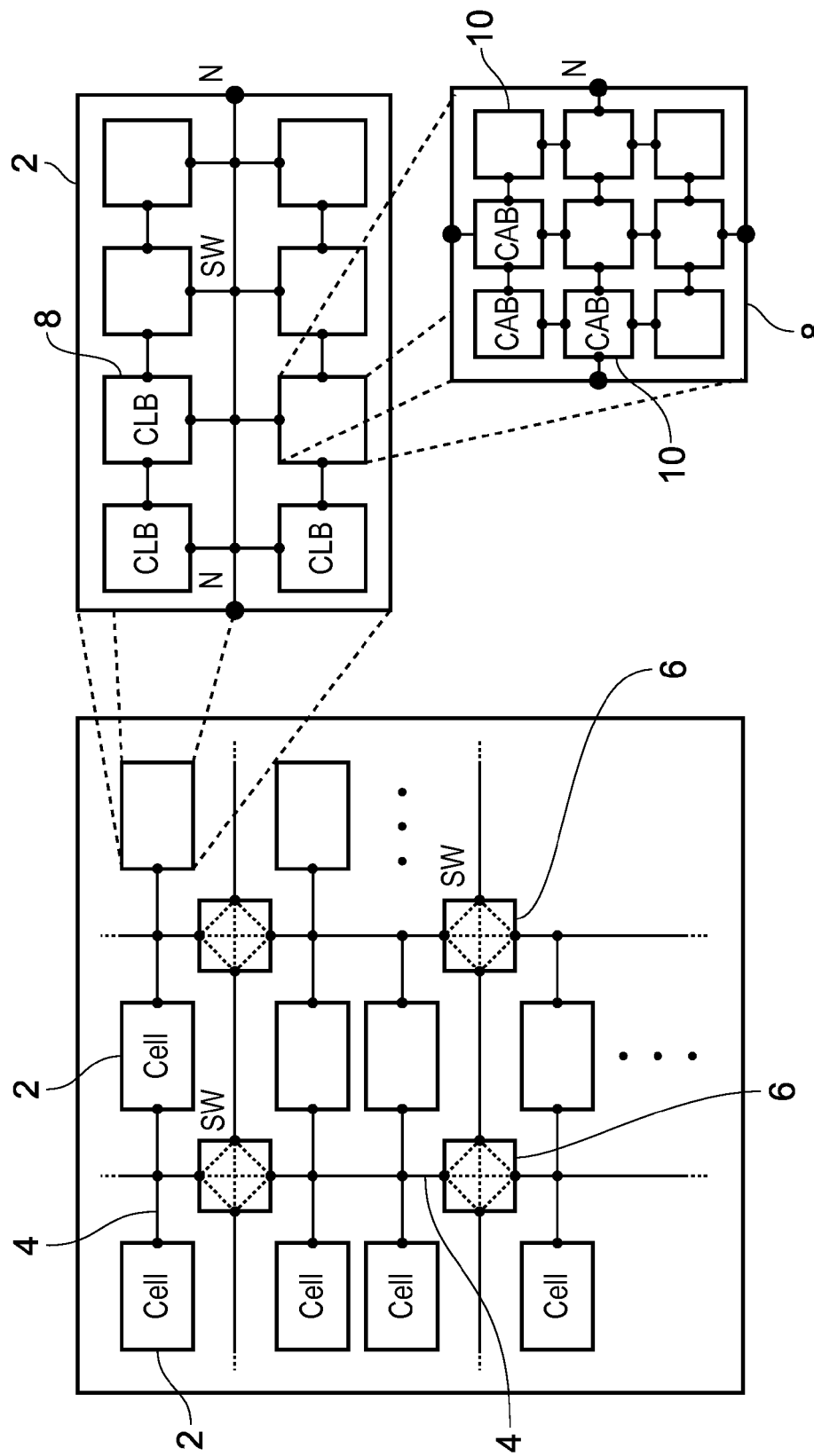
FIG. 1 is a block schematic diagram of the hierarchical structure of an FPGA according to the invention.

With reference to FIG. 1, an FPGA indicated generally at 1 comprises a matrix of cells 2. Logic signals are conveyed between the cells 2 by buses 4 interconnected by switch boxes 6. Each cell 2 contains a number of CLBs 8 and each CLB 8 contains a number of CABs 10. Each CAB 10 is configurable using known FPGA programming techniques to form basic logic building blocks such as logic gates or SRAMs. Together these building blocks are able to form the CLBs 8 into logic functions of the order of a small multiplexer or large combinatorial component. The CLBs 8 are combined to provide complexity at the cell level of the order of a large multiplexer or a random access memory (RAM).

Figure 2:
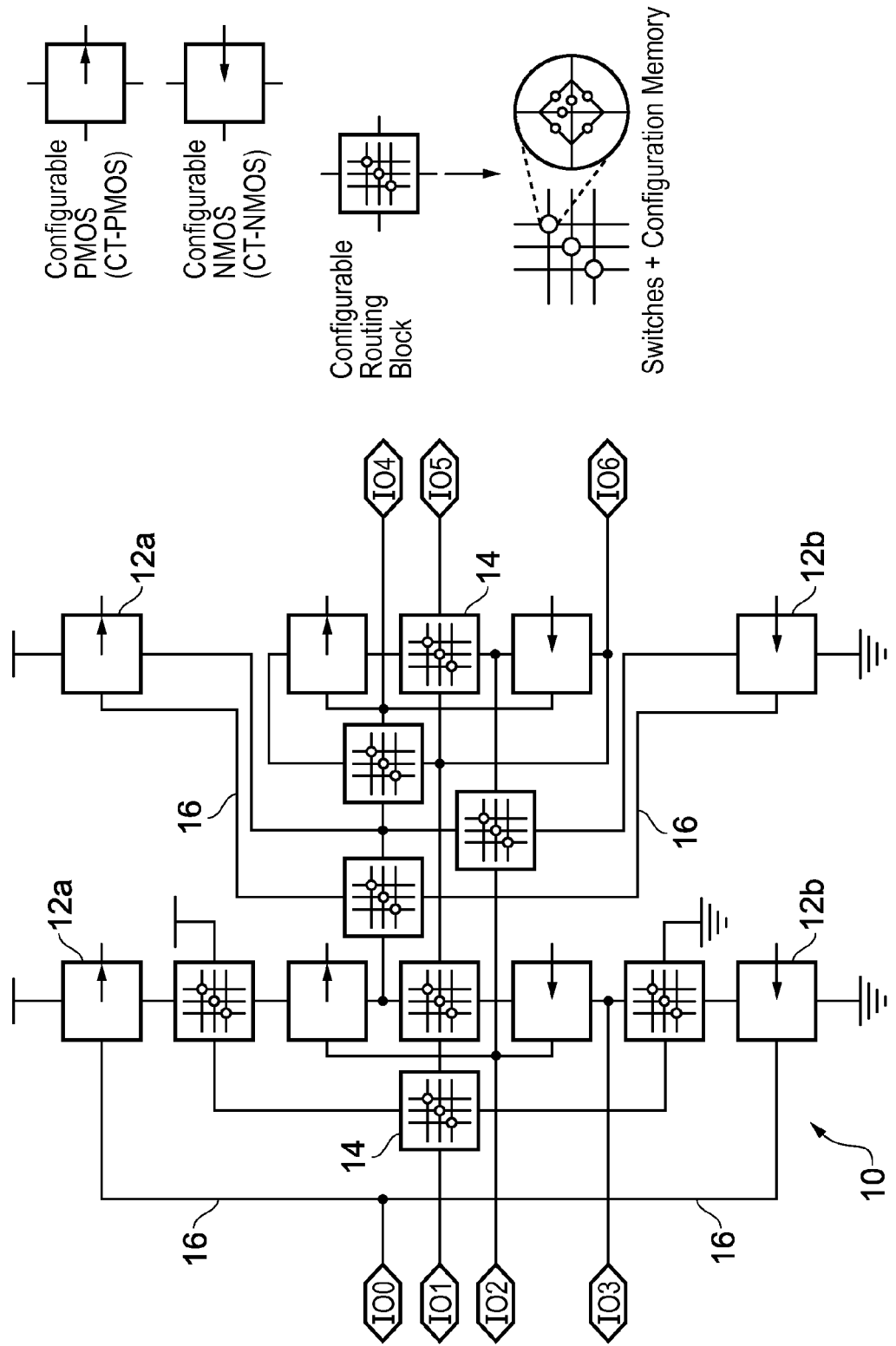
FIG. 2 is a block schematic diagram of the architecture of one example of a CAB useable in the FPGA shown in FIG. 1.

With further reference to FIG. 2, one example of a CAB 10 for use in the FPGA shown in FIG. 1 has eight configurable transistors 12; four PMOS configurable transistors 12a and four NMOS configurable transistors 12b. In addition, each CAB 10 has configuration circuitry comprising eight configurable routing blocks 14 and a network of connections 16.

Each routing block 14 comprises six switches (not shown) and each switch has an associated configuration memory (not shown). Each switch comprises four transistors termed "switching transistors" because they perform switching functions rather than signal processing functions. Each configuration memory comprises an SRAM comprising six switching transistors. The SRAMs are controlled by SRAM control logic. Seven input/outputs, labelled IO0 to IO6, are also provided.

By using the configurable routing blocks 14 and the connections 16 to interconnect the configurable transistors 12 in various different ways, the CAB 10 can be configured into various different logic building blocks. The CABs 10 are limited to realising only the logic building blocks necessary to form the logic functions implementable by the CLBs 8, namely inverters, NOR, NAND, OR, AND, SRAM LATCH and transmission gates, and buffers.

Figure 3:
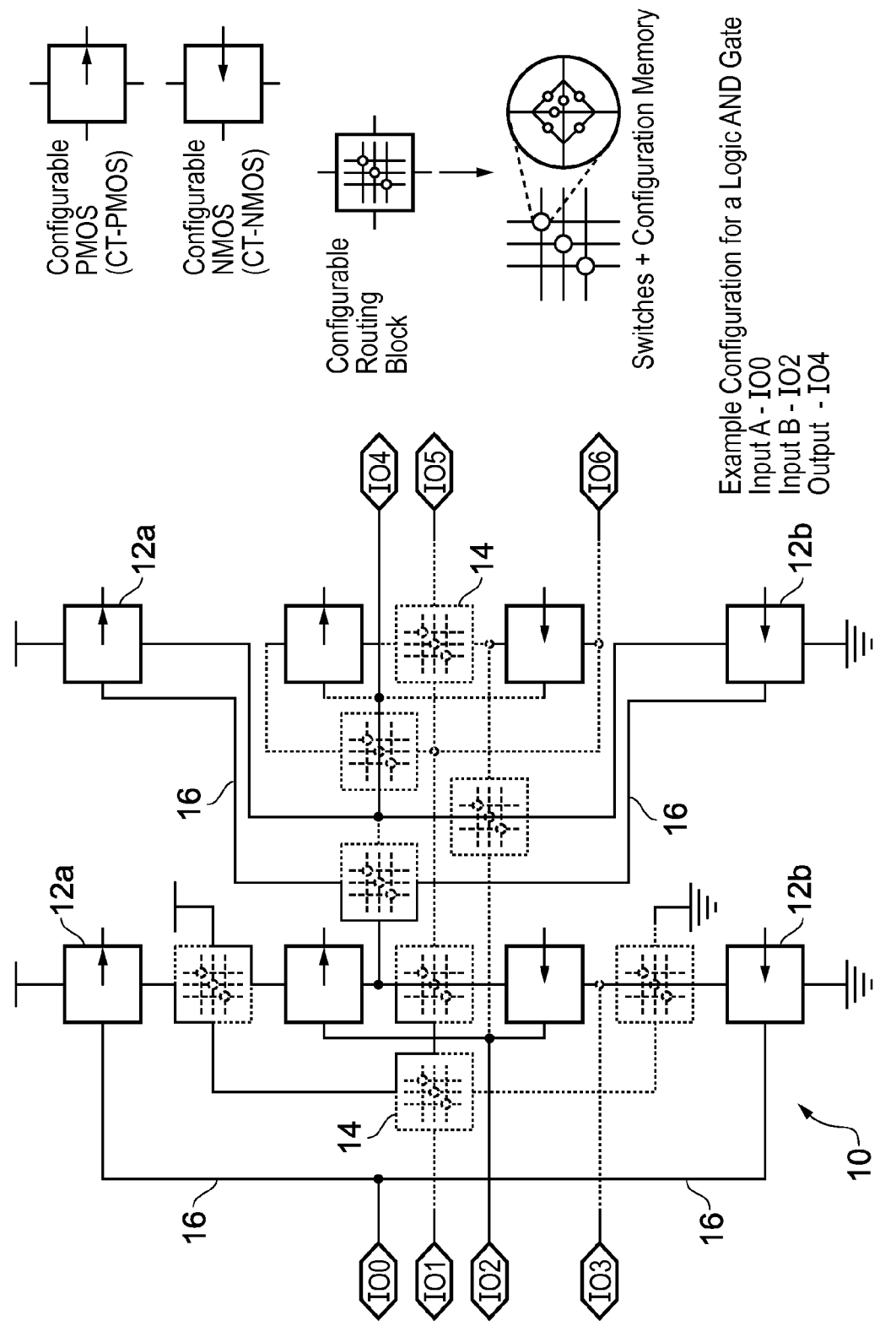
FIG. 3 is a block schematic diagram of the CAB shown of FIG. 2, configured as a logic AND gate.

FIG. 3 shows how the CAB 10 shown in FIG. 2 is configurable as a logic AND gate. The configurable routing blocks 14 are so controlled as to interconnect the configurable transistors 12 to perform as an AND gate with input/output IO0 as input A, input/output IO2 as input B and input/output IO4 as the gate's output. Those items which are active are shown in black; those which are inactive are shown dashed. It will be appreciated that by configuring the configurable routing blocks 14 in other ways, it is possible to implement the other logic building blocks listed above.

Figure 4:
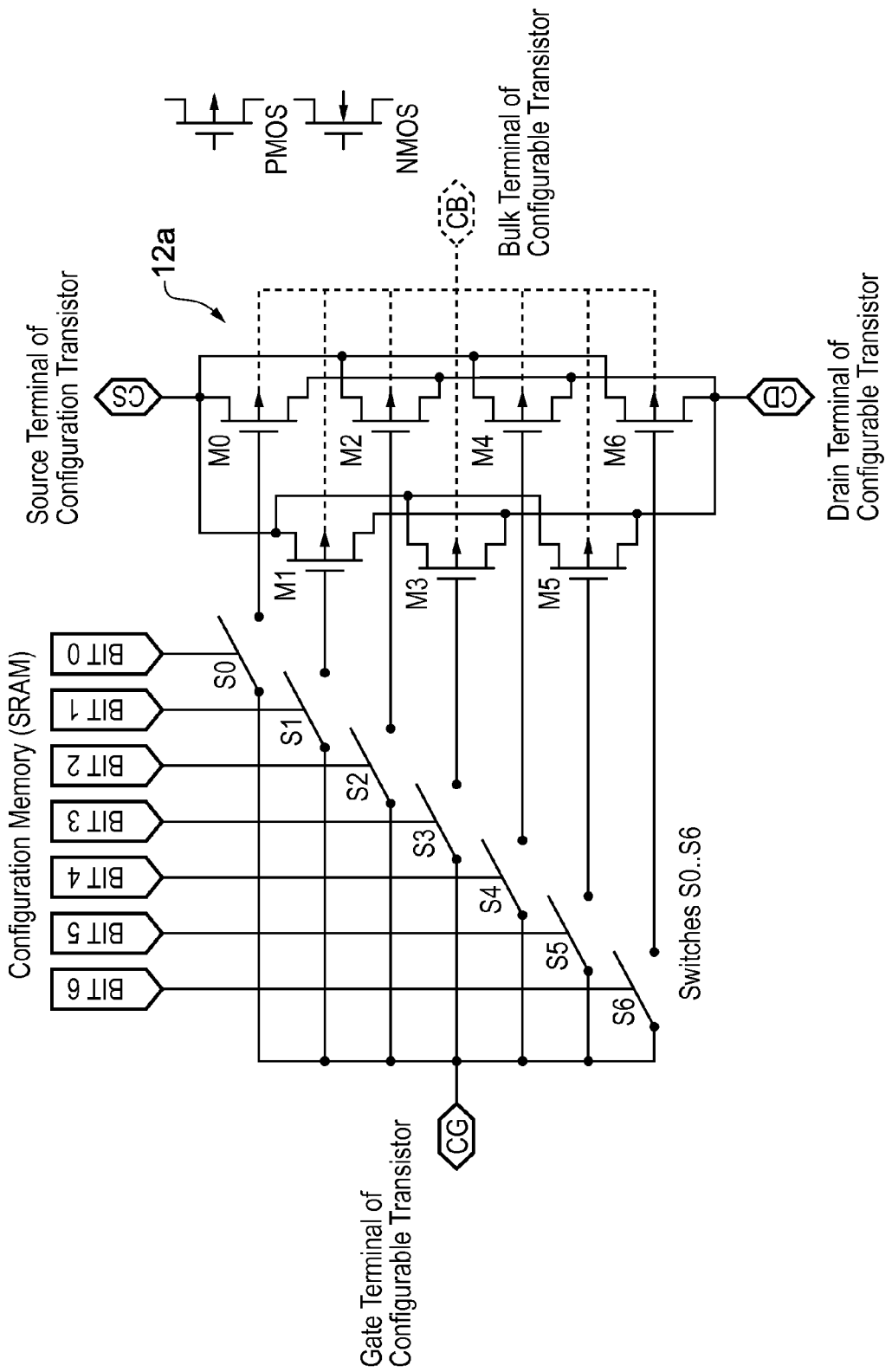
FIG. 4 is a block schematic diagram of one of the configurable transistors of the CAB shown in FIG. 2.

With reference to FIG. 4, one configurable PMOS transistor 12a comprises seven useable PMOS transistors M0-M6 connected in a common source/common drain arrangement. It will be appreciated that each configurable NMOS transistor 12b comprises seven useable NMOS transistors. The useable transistors are termed "useable" because they process signals.

Associated with each of the useable PMOS transistors M, making or breaking the connection between a common gate and the individual gate of each of the useable PMOS transistors M, is a switch S (each switch S0-S6 being numbered in accordance with its corresponding PMOS transistor M0-M6) comprising five switching transistors (not shown). Each switch S has an associated configuration memory BIT (each BIT0-BIT6 being numbered in accordance with its corresponding switch S0-S6) comprising an SRAM (not shown) comprising six switching transistors. Each switch S and associated SRAM together form a programmable switch. The SRAMs are controlled by SRAM control logic (not shown).

Each of the useable PMOS transistors M0-M6 is 40 nm long and each is a different width, varying between 120 nm and 220 nm, so that each useable transistor M may be used alone or each may be combined with one or more other useable transistors M0-M6 to form various lengths and widths. In effect, the configurable transistors 12a can be either single or compound transistors. The useable transistor widths are chosen so that they can be combined to provide incremental values over a full range of values that are uniformly spread. In other words, the increment between successive configurable values is the same. The combination of widths used is such that a range of 120 nm to 1140 nm is realisable in increments of 20 nm.

Once a CAB 10 has been formed into a logic function building block, the length and width of each configurable transistor 12 within the building block may be changed in the interest of optimising the performance of the configuration. In other words, the effects of different lengths and widths of configurable transistor 12 may be observed and the configuration selected which best suits the role of the building block. The optimisation is in terms of industry standard performance metrics, such as balancing power consumption against speed of the configurable transistor 12. Additionally, these performance metrics that are used for optimisation may take into account the effects of stochastic variability in order to improve the reliability of the combination. Accordingly, each configurable transistor 12 may be optimised directly in hardware. Also, although not illustrated, providing a choice of various different layouts of transistor provides a further optimisation option.

The total number of switching transistors is predominantly minimised by limiting the CAB 10 to being capable of realising only the logic building blocks necessary to form the logic functions implementable by the CLBs 8. As a consequence, the ratio of switching transistors to useable transistors is kept low; in the case of the CAB described with reference to FIGS. 1 to 4, the ratio is around 20:1 (which would give a ratio of switching transistors to configurable transistors of around 140:1). However, the ratio of switching transistors to useable transistors could be altered by implementing the switches and SRAMs in the routing block 14 using a different number of switching transistors or implementing the switch S or SRAM associated with each useable transistor M using a different number of switching transistors. For example, using eight switching transistors in the SRAM would result in a ratio of 24:1. In other words, whilst there may be a generally regarded or standard or optimum number of switching transistors required to perform any function, such as a switch, it is possible to perform the same function with an alternative number of switching transistors and each alternative will result in a different switching transistor to useable transistor ratio.

Whilst the example of CAB shown in FIG. 2 performs well, it is prone to parasitic effects as a result of having switches in the source-drain paths between the configurable transistors 12. A further example of a CAB shown in FIG. 5 performs better as regards parasitic effects because it does not have such switches. It also provides a larger number of logic functions, so it represents an advance in capability.

Figure 5:
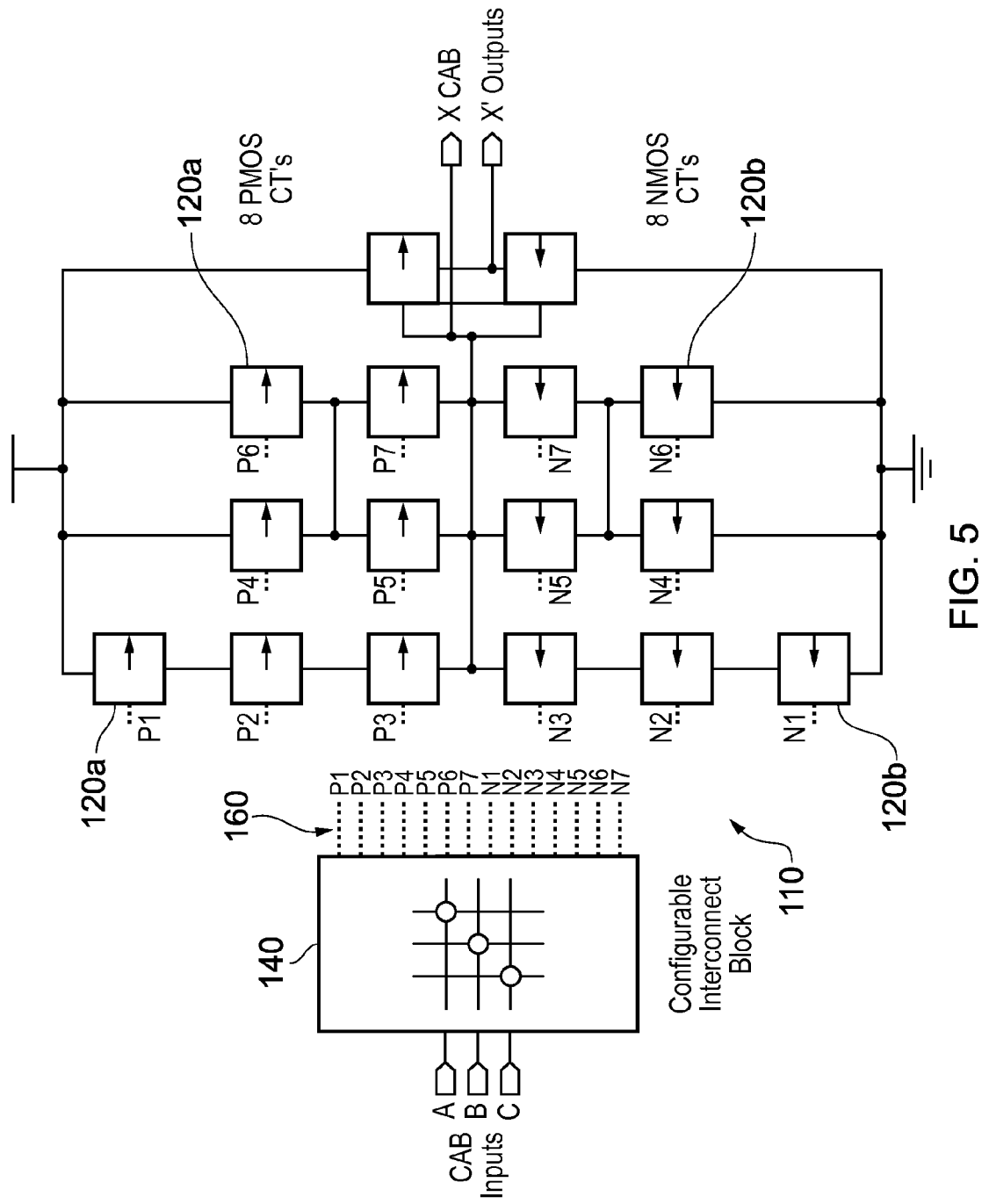
FIG. 5 is a block schematic diagram of the architecture of another example of a CAB useable in the FPGA shown in FIG. 1.

With further reference to FIG. 5, another example of a CAB 110 for use in the FPGA shown in FIG. 1 comprises sixteen configurable transistors 120; eight PMOS configurable transistors 120a and eight NMOS configurable transistors 120b, all arranged in a CMOS-like structure where all source and drain terminals are directly connected and are non-configurable. In addition the CAB 110 has configuration circuitry comprising a configurable interconnect block 140 and a network of connections 160. Although the configurable interconnect block 140 has the same symbol as the configurable routing block 14 shown in FIG. 2, it has a different structure and operates in a different way.

The configurable interconnect block 140 comprises: fourteen switches (not shown), each comprising five switching transistors; one decoder (not shown) comprising ninety-two switching transistors; and, four SRAM BITS (not shown), each comprising six switching transistors. The CAB 110 features three analogue inputs A, B, C and two analogue outputs X, X' (one standard and one inverted).

The configurable interconnect block 140 maps the CAB inputs A, B, C to the gate terminals of the respective configurable transistors 120 for the configured logic building block and is controlled via configuration BITS stored in the configuration SRAMs (not shown) and decoder (not shown). There are fourteen outputs P1-P7, N1-N7 from the interconnect block 140 that make up the network of connections 160, each output going to the correspondingly labelled gate of one of the configurable transistors 120 (although the outputs are not illustrated as being connected). Each output P1-P7, N1-N7 serves either to involve the corresponding configurable transistor 120 in a logic building block, to render the configurable transistor 120 effectively "transparent" in terms of the role it plays in the building block or to shut the corresponding configurable transistor 120 down. The CAB 110 has eight different configuration options, providing sixteen different 1-, 2- and 3-input logic functions, as shown in FIG. 7, using either the standard output X or inverted ouput X'.

The configuration of each of the configurable transistors 120 shown in FIG. 5 is identical to those described with reference to FIG. 4.

Again, as with the CAB 10 shown in FIG. 2, the ratio of useable transistors to switching transistors in the case of the CAB 110 shown in FIG. 5 is kept low by constraining the configuration options of the CAB 110 in such a way that the basic logic functions that can be realised are restricted to those shown in FIG. 7. The ratio for this particular example is around 13:1, which means it exhibits a better ratio than the CAB 10 shown in FIG. 2 in addition to having an advanced capability. However, again, by reducing the number of switching transistors, that is, by providing a configuration of switching transistors that performs the same function (such as switching) as another configuration with a reduced number of transistors, the ratio could be further reduced. For example, by reducing the number of switching transistors in each SRAM bit of each configurable transistor 120 to one, the number in each switch in each configurable transistor 120 to two, the number in each SRAM in the interconnect block 140 to one and the number in each switch in the interconnect block 140 to two, the ratio can be reduced to 5:1. Similarly by increasing the number of switching transistors, the ratio could be increased.

Figure 6:
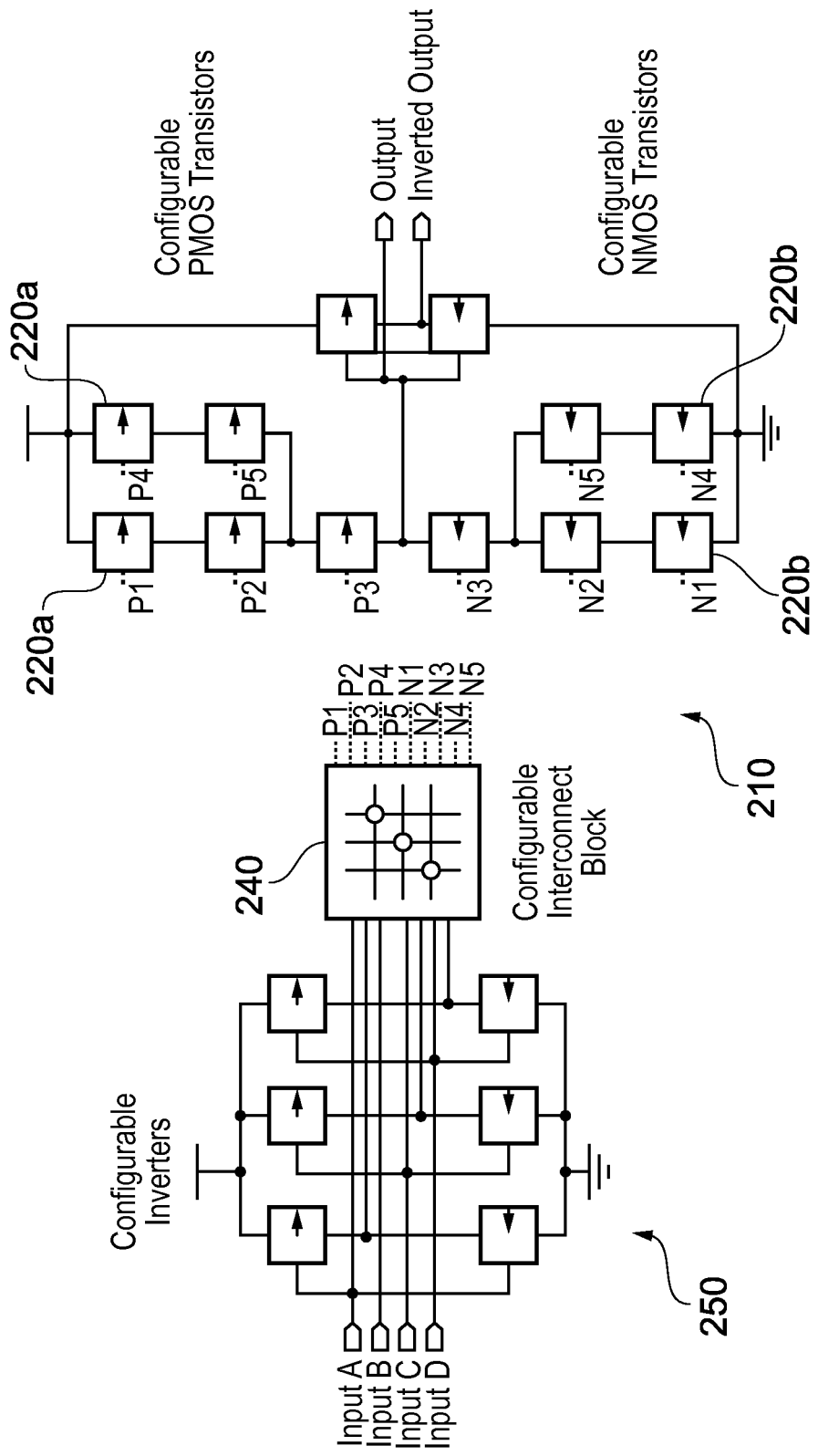
FIG. 6 is a block schematic diagram of the architecture of yet another example of a CAB useable in the FPGA shown in FIG. 1.

Yet another example of a CAB for use in the FPGA shown in FIG. 1 is shown in FIG. 6. Compared to the CAB 110 shown in FIG. 5, the CAB 210 shown in FIG. 6 has a configurable interconnect block 240 which has a different number of inputs A, B, C, D and a different configuration to interconnect block 140. Like the CAB 110 shown in FIG. 5, the CAB 210 shown in FIG. 6 provides sixteen different 1-, 2- and 3-input logic functions, but, because of its different architecture, the logic functions provided by the CAB 210 are different, as illustrated in FIG. 10. Configurable inverters 250 are present between inputs A-D and the configurable interconnect block 240 to provide inverted as well as standard inputs to the configurable interconnect block 240. The CAB 210 has eighteen configurable transistors 220 (six of which (not shown) are in the configurable inverters 250).

The configurable interconnect block 240 comprises switches (not shown) and control logic (not shown) comprising one hundred switching transistors, a decoder (not shown) comprising eighty-six switching transistors and four SRAM BITS (not shown), each comprising six switching transistors. The configuration of each of the configurable transistors 220a, 220b shown in FIG. 6 is identical to those described with reference to FIG. 4. The CAB 210 has a ratio of switching transistors to useable transistors of 13:1. Again, this could be varied by increasing/decreasing the number of switching transistors in the configuration circuitry of the switches and the SRAM of the interconnect block 240 and the configurable transistors 220.

Figure 8:
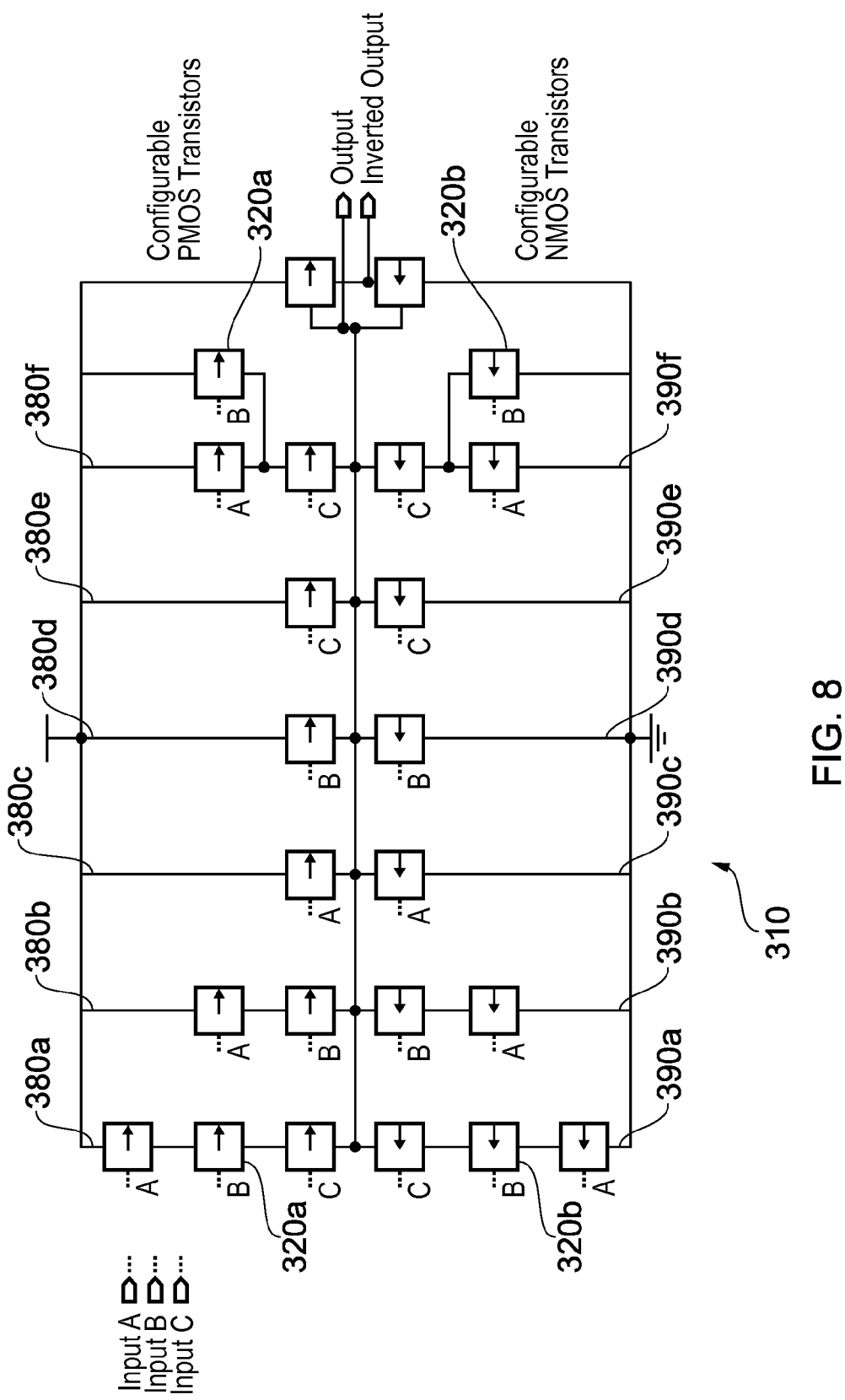
FIG. 8 is a block schematic diagram of the architecture of a further example of a CAB useable in the FPGA shown in FIG. 1.

A further example of a CAB for use in the FPGA shown in FIG. 1 is shown in FIG. 8. The CAB 310 is an alternative configuration to the CAB 110 shown in FIG. 5. Unlike the CAB 110 shown in FIG. 5, the CAB 310 does not have a configurable interconnect block. Instead, the CAB 310 has six PMOS configurable transistor branches 380a-f comprising configurable PMOS transistors 320a and six NMOS configurable transistor branches 390a-f comprising configurable NMOS transistors 320b. Each branch 380, 390 is capable of replicating one of the logic motifs/structures found in the CAB 110 shown in FIG. 5. The logic motifs/structures may be combined to form logic building blocks, meaning that overall the CAB 310 is able to provide the same logic functions as the CAB 110, that is, those shown in FIG. 10.

The configuration of each of the configurable transistors 320a, 320b shown in FIG. 8 is identical to those described with reference to FIG. 4. As a consequence, the ratio of switching transistors to useable transistors for the CAB 310 is 11:1. Again, this could be varied.

Figure 9:
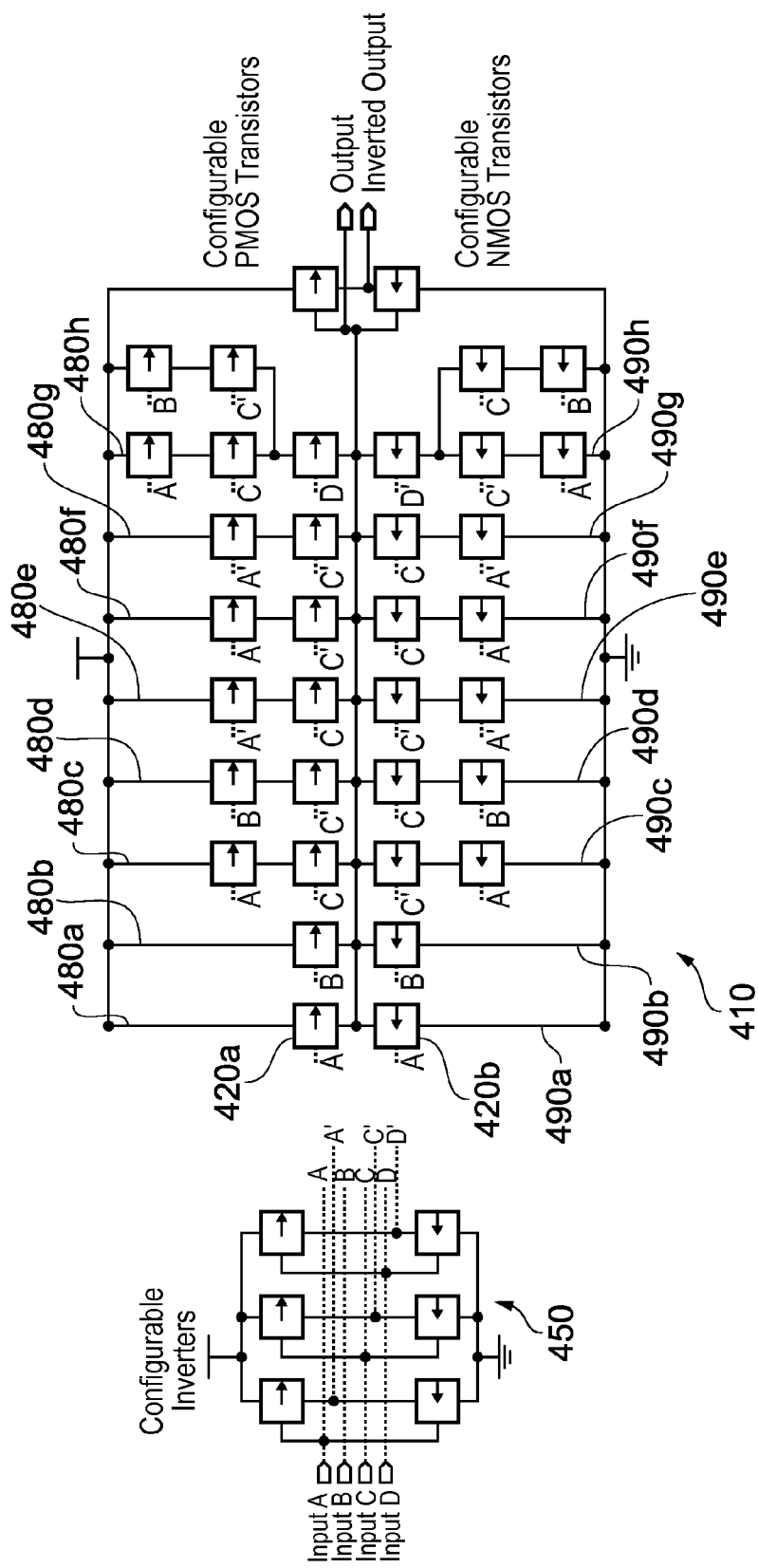
FIG. 9 is a block schematic diagram of the architecture of another further example of a CAB useable in the FPGA shown in FIG. 1.

Another further example of a CAB for use in the FPGA shown in FIG. 1 is shown in FIG. 9. The CAB 410 is an alternative configuration to the CAB 210 shown in FIG. 6. The relationship of the CAB 410 to the CAB 210 is analogous to the relationship between the CAB 310 shown in FIG. 8 and the CAB 110 shown in FIG. 5 in the sense that the CAB 410 has no interconnect block. Instead, the CAB 410 has eight PMOS configurable transistor branches 480a-h comprising configurable PMOS transistors 420a and eight NMOS configurable transistor branches 490a-h comprising configurable NMOS transistors 420b. The CAB 410 also includes configurable inverters 450 to provide inverted inputs. Each of the branches is capable of replicating one of the logic motifs/structures found in the CAB 210 shown in FIG. 6, meaning that overall the CAB 410 is able to provide the same logic functions as the CAB 210 shown in FIG. 6, that is, those shown in FIG. 10.

The configuration of each of the configurable transistors 420 shown in FIG. 10 is identical to those described with reference to FIG. 4. As a consequence, the ratio of switching transistors to useable transistors for the CAB 410 is 11:1. Again, this could be varied as in the earlier embodiments.

Each of the CABs shown in FIGS. 8 and 9 is scalable whilst maintaining a constant ratio of switching transistors to useable transistors to the extent that the ratio would not vary irrespective of how the CABs were scaled to provide further logic functions.

What is claimed is:

1. A field programmable gate array (FPGA) comprising:
   FPGA having a number of configurable logic blocks (CLBs), each CLB having a number of configurable analog blocks (CABs), each CAB comprising:
   a number of configurable transistors each comprising one or more useable transistors and a number of switching transistors; and
   configuration circuitry comprising a number of switching transistors;
   wherein the ratio of switching transistors to useable transistors for each CAB is less than 26:1.

2. The FPGA of claim 1, wherein the configuration circuitry comprises a number of configurable routing blocks each used to connect two or more configurable transistors together to form into logic building blocks.

3. The FPGA of claim 2, wherein each configurable routing block comprises a number of switches and each switch has an associated configuration memory, wherein each switch comprises a number of the switching transistors from the configuration circuitry and each configuration memory comprises an SRAM comprising one or more switching transistors from the configuration circuitry.

4. The FPGA of claim 1, wherein the configuration circuitry comprises a configurable interconnect block adapted to configure the configurable transistors into logic building blocks.

5. The FPGA of claim 4, wherein the configurable interconnect block has an output for each configurable transistor and each output serves to involve the corresponding configurable transistor in a logic function, to render the corresponding configurable transistor effectively "transparent" in terms of the role it plays in the logic function or to shut the corresponding configurable transistor down.

6. The FPGA of claim 5, wherein the configurable interconnect block comprises: a number of switches, each comprising a number of switching transistors from the configuration circuitry; a decoder comprising a number of switching transistors from the configuration circuitry; and, a number of SRAM BITS, each comprising one or more switching transistors from the configuration circuitry.

7. The FPGA of claim 6, further comprising configurable inverters.

8. The FPGA of claim 1, wherein the configurable transistors are arranged in configurable transistor branches and each branch represents at least one logic motifs/structures.

9. The FPGA of claim 8, wherein the logic motifs/structures are combined to form logic building blocks.

10. The FPGA of claim 9, further comprising configurable inverters.

11. The FPGA of claim 1, wherein each configurable transistor comprises a number of useable transistors, wherein each useable transistor is a different length and/or width and various different lengths and widths of useable transistor are combined to form various different lengths and widths of configurable transistor.

12. The FPGA of claim 11, wherein the widths of the various different useable transistors are selected so that the useable transistors can be combined into a range of configurable transistor width values, and wherein the increment between each successive value in the range is the same.

13. The FPGA of claim 12, wherein each configurable transistor comprises seven useable transistors each 40 nm long and ranging in width from 120 nm to 220 nm.

14. The FPGA of claim 1, wherein each configurable transistor comprises a number of useable transistors and each useable transistor is one of a number of different layouts.

15. The FPGA of claim 1, wherein each useable transistor has an associated programmable switch comprising a switch and a configuration memory, and the switch comprises a number of the switching transistors from the configurable transistor and the configuration memory comprises one or more switching transistors from the configurable transistor.

16. A method of configuring a field programmable gate array (FPGA) having a number of configurable logic blocks (CLBs), each CLB having a number of configurable analog blocks (CABs), each CAB including a number of configurable transistors each comprising one or more useable transistors and a number of switching transistors and configuration circuitry comprising a number of switching transistors, wherein the ratio of switching transistors to useable transistors for each CAB is less than 26:1, the method comprising:
    optimising each configurable transistor.

17. The method of claim 16, wherein each configurable transistor is optimised for industry standard performance metrics including at least one of speed and power consumption.

18. The method of claim 17, wherein each configurable transistor is optimised for industry standard performance metrics accounting for stochastic variability.

19. A method of configuring a field programmable gate array (FPGA) having a number of configurable logic blocks (CLBs), each CLB having a number of configurable analog blocks (CABs), each CAB including a number of configurable transistors each comprising one or more useable transistors and a number of switching transistors; and configuration circuitry comprising a number of switching transistors, wherein the ratio of switching transistors to useable transistors for each CAB is less than 26:1, the method comprising scaling logic functionality of the CAB whilst maintaining a constant ratio of switching transistors to useable transistors.

\* \* \* \* \*